(12) United States Patent
Ito

(10) Patent No.: US 11,429,004 B2
(45) Date of Patent: Aug. 30, 2022

(54) ELECTRO-OPTICAL DEVICE HAVING PREDETERMINED ELEMENT IN INSULATING LAYERS, ELECTRONIC APPARATUS AND METHOD FOR MANUFACTURING ELECTRO-OPTICAL DEVICE

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 146 days.

(21) Appl. No.: 16/811,256

(22) Filed: Mar. 6, 2020

(65) Prior Publication Data

US 2020/0285091 A1 Sep. 10, 2020

(30) Foreign Application Priority Data

Mar. 7, 2019 (JP) .............................. JP2019-041343

(51) Int. Cl.
*G02F 1/1368* (2006.01)
*H01L 27/12* (2006.01)
(Continued)

(52) U.S. Cl.
CPC ...... *G02F 1/1368* (2013.01); *G02F 1/136209* (2013.01); *G02F 1/136286* (2013.01); *G03B 21/006* (2013.01); *H01L 27/124* (2013.01); *H01L 27/1248* (2013.01); *H01L 27/1259* (2013.01); *G02F 1/13685* (2021.01); *G02F 1/136295* (2021.01); *G02F 2202/104* (2013.01); *H01L 21/02532* (2013.01); *H01L 21/02592* (2013.01); *H01L 21/02667* (2013.01);
(Continued)

(58) Field of Classification Search
CPC combination set(s) only.
See application file for complete search history.

(56) References Cited

U.S. PATENT DOCUMENTS 5,771,110 A 6/1998 Hirano et al.
6,500,704 B1 12/2002 Hirano et al.
(Continued)

FOREIGN PATENT DOCUMENTS

JP H06-12508 A 1/1994
JP H09-107108 A 4/1997
(Continued)

*Primary Examiner* — Lauren Nguyen
(74) *Attorney, Agent, or Firm* — Oliff PLC

(57) ABSTRACT

An electro-optical device includes a translucent substrate, a transistor, a light-shielding body having light-shielding properties, including a metal and disposed between the substrate and the transistor, a first insulating layer having insulating properties and disposed between the light-shielding body and the transistor, the first insulating layer being in contact with the light-shielding body, and a second insulating layer having insulating properties and disposed between the first insulating layer and the transistor, the second insulating layer being in contact with the first insulating layer. A content of a predetermined element that is not an element of a main component in the first insulating layer is higher than a content of the predetermined element in the second insulating layer.

8 Claims, 12 Drawing Sheets

(51) Int. Cl.
  *G02F 1/1362*  (2006.01)
  *G03B 21/00*  (2006.01)
  *H01L 21/02*  (2006.01)
  *H01L 29/786*  (2006.01)
  *H01L 29/66*  (2006.01)
(52) U.S. Cl.
  CPC .... *H01L 27/1274* (2013.01); *H01L 29/66757* (2013.01); *H01L 29/78675* (2013.01)

(56) References Cited

U.S. PATENT DOCUMENTS

| | | | |
|---|---|---|---|
| 2001/0020702 A1 | 9/2001 | Hirano et al. | |
| 2002/0164843 A1 | 11/2002 | Yamazaki et al. | |
| 2005/0014316 A1 | 1/2005 | Hirano et al. | |
| 2007/0002199 A1* | 1/2007 | Fujikawa | G02F 1/136209 349/43 |
| 2009/0147188 A1* | 6/2009 | Yang | G02F 1/133516 349/106 |
| 2010/0141877 A1* | 6/2010 | Huang | G02B 5/201 264/2.7 |
| 2012/0080664 A1* | 4/2012 | Kim | H01L 27/3276 257/40 |
| 2012/0119322 A1* | 5/2012 | Tada | G02F 1/136209 257/532 |
| 2017/0207414 A1* | 7/2017 | Wu | G02B 1/14 |
| 2018/0188621 A1* | 7/2018 | Qi | G03F 7/00 |

FOREIGN PATENT DOCUMENTS

| | | |
|---|---|---|
| JP | 2002-26299 A | 1/2002 |
| JP | 2003-066427 A | 3/2003 |
| JP | 2003-173967 A | 6/2003 |
| JP | 2005-250234 A | 9/2005 |

\* cited by examiner

ELECTRO-OPTICAL DEVICE HAVING PREDETERMINED ELEMENT IN INSULATING LAYERS, ELECTRONIC APPARATUS AND METHOD FOR MANUFACTURING ELECTRO-OPTICAL DEVICE

The present application is based on, and claims priority from JP Application Serial Number 2019-041343, filed Mar. 7, 2019, the disclosure of which is hereby incorporated by reference herein in its entirety.

BACKGROUND

1. Technical Field

The present disclosure relates to an electro-optical device, an electronic apparatus, and a method for manufacturing an electro-optical device.

2. Related Art

Electro-optical devices such as liquid crystal apparatuses are known. A liquid crystal apparatus is used as a light valve in a liquid crystal projector, for example. JP-A-2005-250234 discloses an electro-optical device including an element substrate, a counter substrate, and a liquid crystal disposed between the element substrate and the counter substrate. The element substrate includes a quartz substrate, a plurality of pixel electrodes arranged in a matrix and spaced apart from the quartz substrate, and a thin-film transistor (TFT) disposed to correspond with each pixel electrode.

In the element substrate described in JP-A-2005-250234, a light-shielding film is disposed below the TFT via a base insulating layer in order to reduce the amount of light incident on the TFT.

Impurities in the light-shielding film may diffuse into the base insulating layer when manufacturing the TFT. When one base insulating layer is interposed between the TFT and the light-shielding film, the TFT is more susceptible to any impurities that have diffused into the base insulating layer. As a result, if the underlying insulating layer contains a large amount of impurities, those impurities may adversely affect the properties of the TFT.

SUMMARY

One aspect of an electro-optical device according to the present disclosure includes a translucent substrate, a transistor, a light-shielding body having light-shielding properties and including a metal, and disposed between the substrate and the transistor, a first insulating layer having insulating properties and disposed between the light-shielding body and the transistor, the first insulating layer being in contact with the light-shielding body, and a second insulating layer having insulating properties and disposed between the first insulating layer and the transistor, the second insulating layer being in contact with the first insulating layer, in which a content of a predetermined element that is not an element of a main component in the first insulating layer is higher than a content of the predetermined element in the second insulating layer.

One aspect of an electro-optical device according to the present disclosure includes a translucent substrate, a transistor, a material layer including a silicon-based inorganic material and disposed between the substrate and the transistor, a first insulating layer having insulating properties and disposed between the material layer and the transistor, the first insulating layer being in contact with the material layer, and a second insulating layer having insulating properties and disposed between the first insulating layer and the transistor, the second insulating layer being in contact with the first insulating layer, in which a content of a predetermined element that is not an element of a main component in the first insulating layer is higher than a content of the predetermined element in the second insulating layer.

One aspect of a method for manufacturing an electro-optical device according to the present disclosure includes the steps of preparing a translucent substrate, forming a light-shielding material including a metal at the substrate, forming a first insulating layer having insulating properties at the light-shielding body in contact with the light-shielding body, forming a second insulating layer having insulating properties at the first insulating layer in contact with the first insulating layer, and forming a transistor at the first insulating layer, in which a content of a predetermined element that is not an element of a main component in the first insulating layer is higher than a content of the predetermined element in the second insulating layer.

DESCRIPTION OF EXEMPLARY EMBODIMENTS

Figure 1:
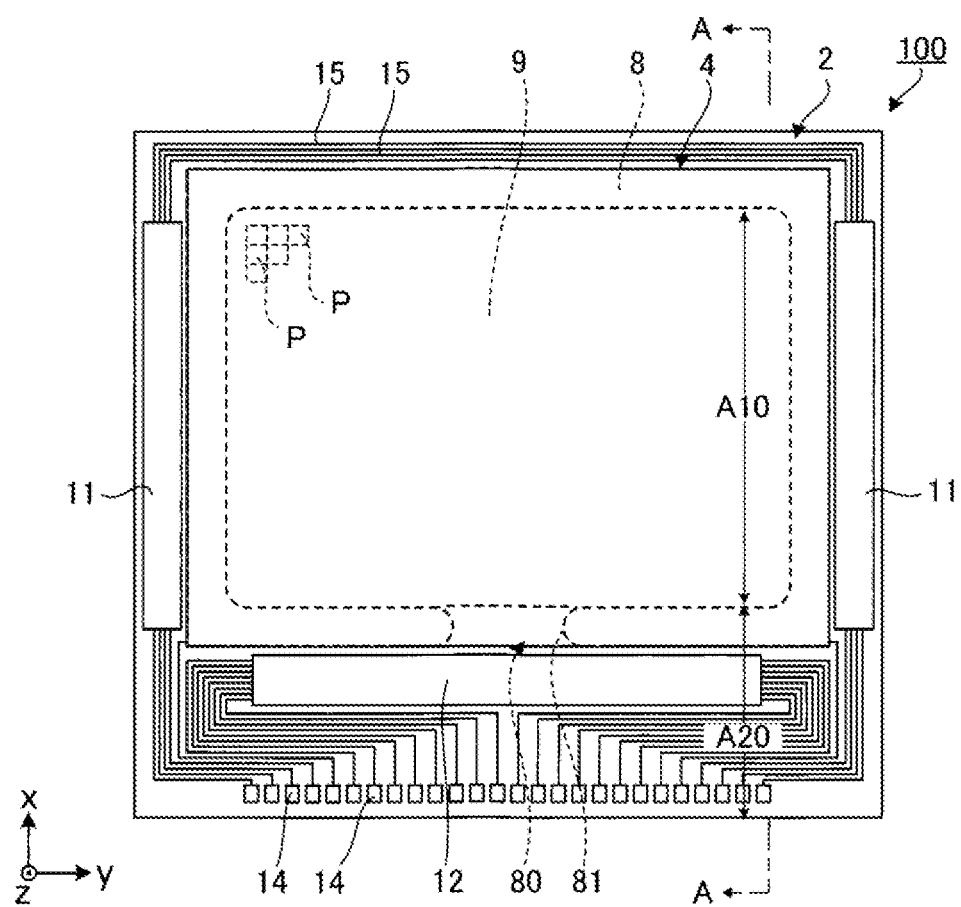
FIG. 1 is a plan view illustrating an electro-optical device according to a first embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the present disclosure in the following descriptions.

1. Electro-Optical Apparatus

1-1. First Embodiment

An active matrix liquid crystal display device will be described as an example of an electro-optical device according to the present disclosure.

1-1a. Basic Configuration

Figure 2:
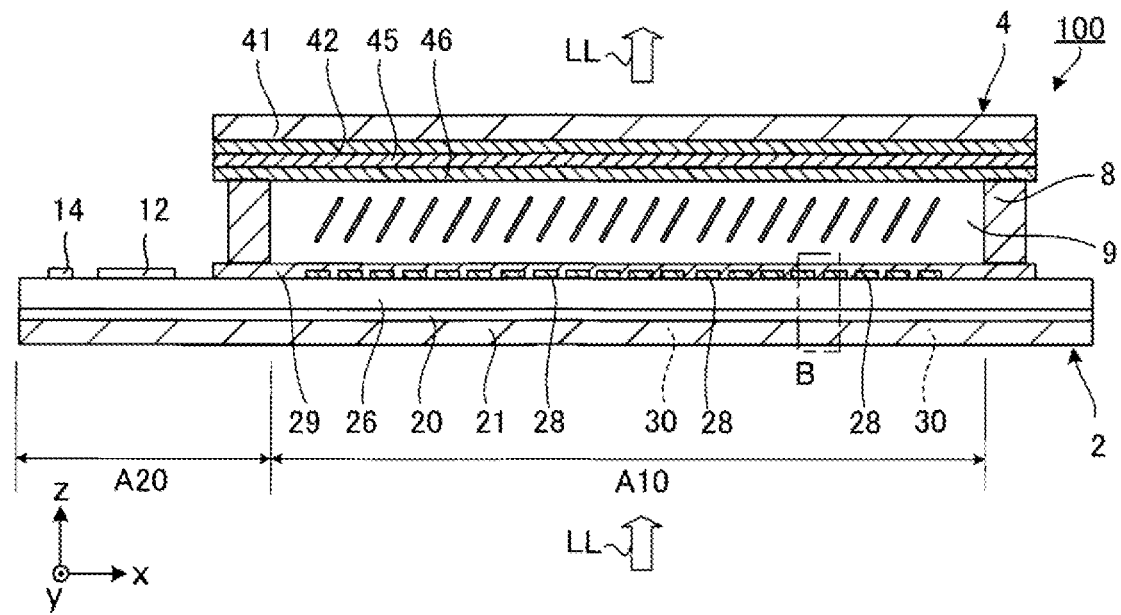
FIG. 2 is a cross-sectional view illustrating the electro-optical device according to the first embodiment.

FIG. 1 is a plan view illustrating an electro-optical device 100 according to a first embodiment. FIG. 2 is a cross-sectional view illustrating the electro-optical device 100 according to the first embodiment and is a cross-sectional view taken along A-A in FIG. 2. Note that, for convenience of explanation, the following description will refer to the x-axis, y-axis, and z-axis illustrated in FIGS. 1 and 2 as required. These axes are orthogonal to each other.

The electro-optical device 100 illustrated in FIGS. 1 and 2 serves as a transmissive-type liquid crystal display device. As illustrated in FIG. 2, the electro-optical device 100 includes a translucent element substrate 2, a translucent counter substrate 4, a frame-shaped seal portion 8, and a liquid crystal layer 9. The seal portion 8 is disposed between the element substrate 2 and the counter substrate 4. The liquid crystal layer 9 is provided in an area surrounded by the element substrate 2, the counter substrate 4 and the seal portion 8. With this arrangement, the element substrate 2, the liquid crystal layer 9 and the counter substrate 4 are aligned in the z-direction with the front surface of the element substrate 2 parallel to the x-y plane. Herein, "plan view" refers to when the element substrate 2 is viewed in the z-direction parallel to the thickness direction of a first base 21 to be described later.

As illustrated in FIG. 2, the present embodiment deals with an exemplary case where light LL is incident on the electro-optical device 100 from the element substrate 2, passes through the liquid crystal layer 9 and is emitted from the counter substrate 4. However, the light LL may be incident from the counter substrate 4. Herein, light incident on the electro-optical device 100, light passing through the electro-optical device 100 and light emitted from the electro-optical device 100 are all referred to as light LL without any distinction. The light LL is visible light and "translucent" herein refers to transmittance to visible light, preferably that transmittance of visible light is more than or equal to 50%. As illustrated in FIG. 1, the electro-optical device 100 has a rectangular shape in plan view, but the planar shape of the electro-optical device 100 is not limited to a rectangular shape and may be, for example, a round shape.

As illustrated in FIG. 1, the element substrate 2 has a size that encompasses the counter substrate 4 in plan view. As illustrated in FIG. 2, the element substrate 2 includes a first base 21 as a "base member", an insulating layer 20, a wiring layer 26, a plurality of pixel electrodes 28, and a first alignment film 29. The first base 21, the wiring layer 26, the plurality of pixel electrodes 28, and the first alignment film 29 are layered on top of each other in this order. The first alignment film 29 is located closest to the liquid crystal layer 9. A plurality of light-shielding bodies 30 are disposed on the first base 21. The first base 21 is formed of a translucent flat plate having insulating properties. The first base 21 is formed of glass or quartz, for example. Each pixel electrode 28 is formed of a translucent electrode material such as indium tin oxide (ITO) or indium zinc oxide (IZO) and can transmit light. The first alignment film 29 aligns the liquid crystal molecules in the liquid crystal layer 9. Examples of the material used to form the first alignment film 29 include polyimide and silicon oxide. Note that the wiring layer 26, the light-shielding body 30 and the insulating layer 20 will be described in detail below.

As illustrated in FIG. 2, the counter substrate 4 includes a second base 41, an insulating layer 42, a counter electrode 45, and a second alignment film 46. The second base 41, the insulating layer 42, the counter electrode 45, and the second alignment film 46 are layered on top of each other in this order. The second orientation film 46 is located closest to the liquid crystal layer 9. The second base 41 is formed of a translucent flat plate having insulating properties. The second base 41 is formed of glass or quartz, for example. The insulating layer 42 is formed of a silicon-based inorganic material having translucent and insulating properties, such as silicon oxide. The counter electrode 45 is formed of a translucent electrode material such as ITO or IZO. The second alignment film 46 aligns the liquid crystal molecules in the liquid crystal layer 6. Examples of the material used to form the second alignment film 46 include polyimide and silicon oxide.

The seal portion 8 is formed using, for example, an adhesive containing various types of curable resins such as epoxy resin. The seal portion 8 is fixed to both the element substrate 2 and the counter substrate 4. As illustrated in FIG. 1, an injection port 81 for injecting a liquid crystal material containing liquid crystal molecules is formed in a portion of the sealing member 8. The injection port 81 is sealed using an encapsulant 80 formed of various types of resin materials.

The liquid crystal layer 9 illustrated in FIG. 2 contains liquid crystal molecules having positive or negative dielectric anisotropy. The liquid crystal layer 9 is interposed between the element substrate 2 and the counter substrate 4 such that the liquid crystal molecules are in contact with both the first alignment film 29 and the second alignment film 46. The alignment of the liquid crystal molecules in the liquid crystal layer 9 varies depending on the voltage applied to the liquid crystal layer 9. Modulating the light LL according to the applied voltage allows the liquid crystal layer 6 to display the light LL in grayscale.

As illustrated in FIG. 1, a plurality of scanning line driver circuits 11 and a signal line driver circuit 12 are arranged on a surface of the element substrate 2 close to the counter substrate 4. A plurality of external terminals 14 are provided on a surface of the element substrate 2 close to the counter substrate 4. Each external terminal 14 is coupled to routed wiring 15 routed from each of the scanning line driver circuits 11 and the signal line driver circuit 12.

The electro-optical device 100 configured as described above has a display area A10 in which images and the like are displayed, and a peripheral area A20 that surrounds the display area A10 in plan view. The display area A10 includes a plurality of pixels P arranged in a matrix. The scanning line driver circuits 11, the signal line driver circuit 12 and other components are disposed in the peripheral area A20.

1-1b. Electrical Configuration

Figure 3:
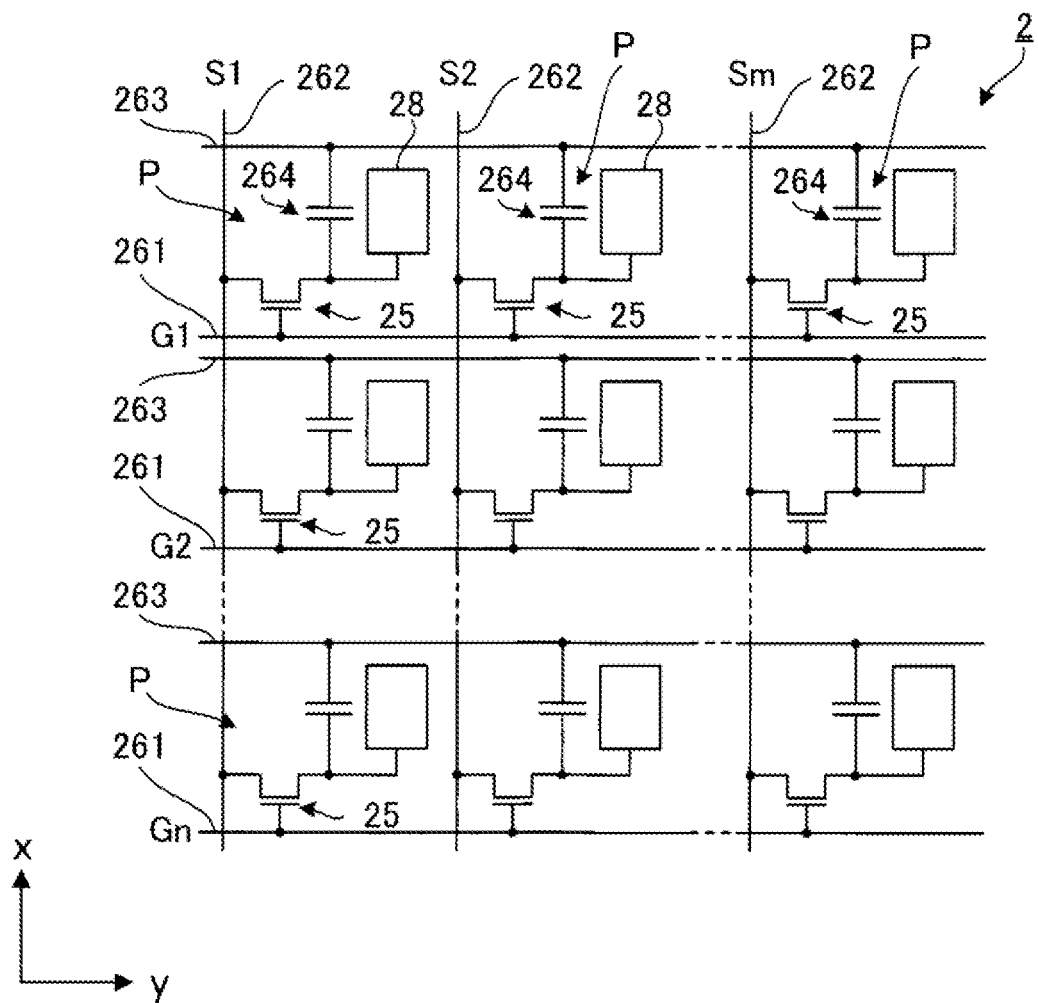
FIG. 3 is an equivalent circuit diagram illustrating the electrical configuration of an element substrate according to the first embodiment.

FIG. 3 is an equivalent circuit diagram illustrating the electrical configuration of the element substrate 2 according to the first embodiment. As illustrated in FIG. 3, n-number of scanning lines 261, m-number of signal lines 262 and n-number of capacitance lines 263 are formed on the element substrate 2. Note that both n and m are integers of 2 or more. A TFT 25 is arranged as a "transistor" corresponding to each intersection between the n-number of scanning lines 261 and the m-number of signal lines 262. The TFT 25 functions as a switching element.

The n-number of scanning lines 261 each extend in the y-direction and are arranged at equal intervals in the x-direction. Each scanning line 261 is electrically coupled to a gate of the TFT 25. The n-number of scanning lines 261 are electrically coupled to the scanning line driver circuits 11 illustrated in FIG. 1. The n-number of scanning lines 261 are line-sequentially supplied with scanning signals G1, G2, . . . , Gn output from the scanning line driver circuits 11.

The m-number of signal lines 262 illustrated in FIG. 3 each extend in the x-direction and are arranged at equal intervals in the y-direction. Each signal line 262 is electrically coupled to a source of the TFT 25. The m-number of signal lines 262 are electrically coupled to the signal line driver circuit 12 illustrated in FIG. 1. Image signals S1, S2, . . . , Sm are supplied to the m-number of signal lines 262 in parallel from the signal line driver circuit 12 illustrated in FIG. 1.

The n-number of scanning lines 261 and the m-number of signal lines 262 illustrated in FIG. 3 are insulated from each other and arranged in a lattice-like manner in plan view. An area surrounded by two adjacent scanning lines 261 and two adjacent signal lines 262 corresponds to one pixel P. One pixel electrode 28 is formed in one pixel P. Each pixel electrode 28 is electrically coupled to the TFT 25.

The n-number of capacitance lines 263 each extend in the y-direction and are arranged at equal intervals in the x-direction. The n-number of capacitance lines 263 are insulated from the plurality of signal lines 262 and the plurality of scanning lines 261, and are formed separated from these lines. A fixed potential such as a ground potential is applied to the capacitance lines 263. A storage capacitor 264 is provided in parallel with a liquid crystal capacitor between the capacitance lines 263 and the pixel electrodes 28 to prevent charge held in the liquid crystal capacitor from leaking.

When the scanning signals G1, G2, . . . , Gn become sequentially active and the n-number of scanning lines 261 are sequentially selected, the TFT 25 coupled to the selected scanning line 261 turns on. Then, the image signals S1, S2, . . . , Sm having magnitudes commensurate with the grayscale to be displayed via the m-number of signal lines 262 are incorporated into the pixels P corresponding to the selected scanning lines 261 and applied to the pixel electrodes 28. With this, voltage commensurate with the grayscale to be displayed can be applied to the liquid crystal capacitor formed between the pixel electrodes 28 and the counter electrode 45 in the counter substrate 4 illustrated in FIG. 2. As a result, the alignment of the liquid crystal molecules varies according to the applied voltage. The applied voltage is held by the storage capacitor 264. Such a variation in the alignment of the liquid crystal molecules causes the light LL to be modulated, to thus enable grayscale display.

1-1c. Wiring Layer 26 of Element Substrate 2

Figure 4:
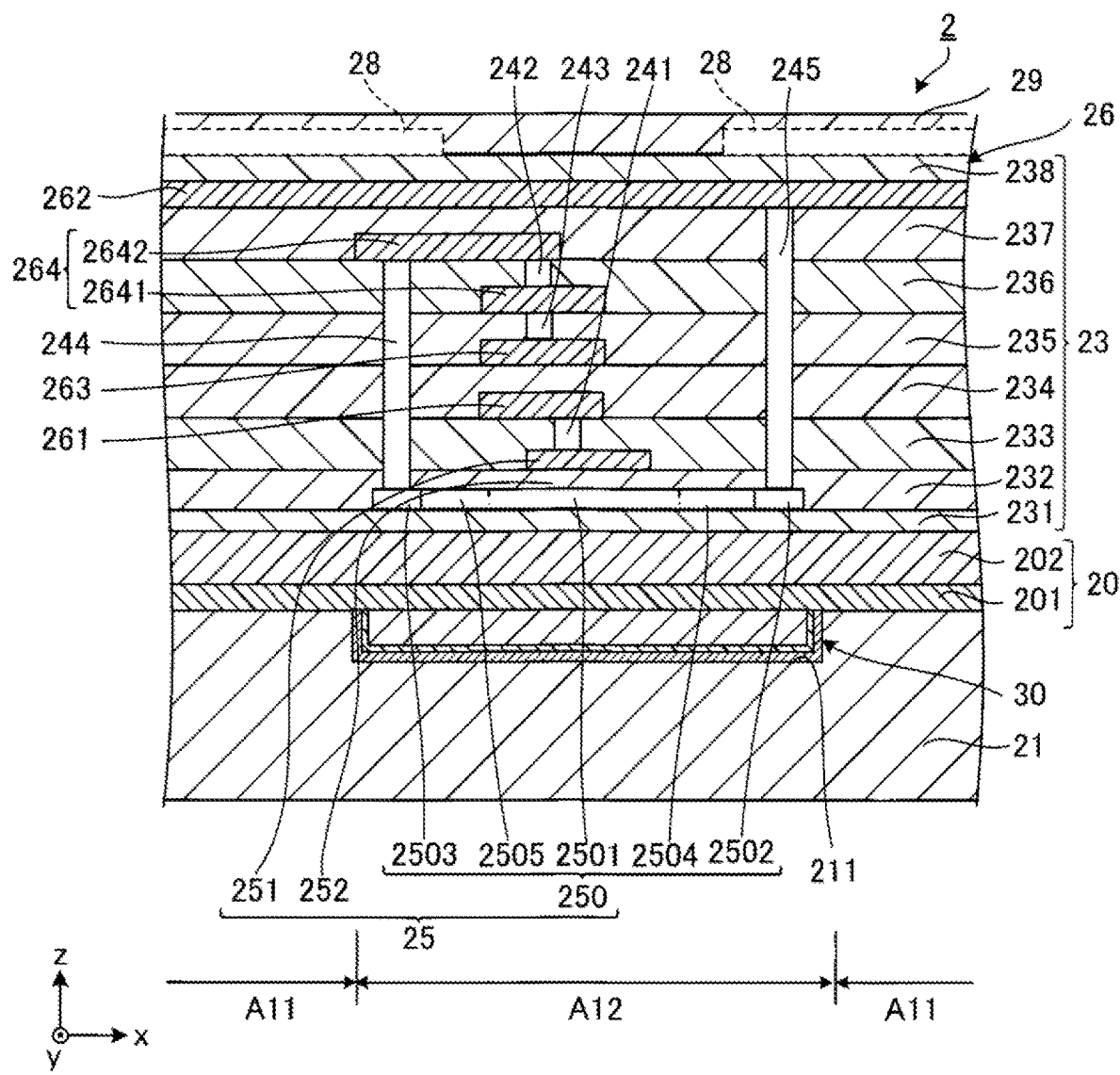
FIG. 4 is a partial cross-sectional view illustrating the element substrate according to the first embodiment.

FIG. 4 is a partial cross-sectional view illustrating the element substrate 2 according to the first embodiment, and is an enlarged view of the area B in FIG. 2. The wiring layer 26 includes a plurality of light transmission areas A11 through which the light LL passes, and a wiring area A12 in which the TFT 25 and various wires are arranged. The wiring area A12 blocks the light LL. Although not illustrated in detail, the wiring area A12 has a lattice shape in plan view. The wiring area A12 surrounds the light transmission areas A11 in plan view. The plurality of light transmission areas A11 are arranged in a matrix in plan view. The light transmission areas A11 each have a substantially quadrangular shape in plan view.

As illustrated in FIG. 4, the wiring layer 26 includes the TFT 25, the scanning lines 261, the capacitance lines 263, the signal lines 262, and the storage capacitor 264. Note that the order in which the TFT 25, the scanning lines 261, the capacitance lines 263, the storage capacitor 264, and the signal lines 262 illustrated in FIG. 4 are arranged is merely exemplary and not limited to the illustrated example. The wiring layer 26 also includes a translucent insulating body 23 having insulating properties. The insulating body 23 includes a first interlayer insulating film 231, a second interlayer insulating film 232, a third interlayer insulating film 233, a fourth interlayer insulating film 234, a fifth interlayer insulating film 235, a sixth interlayer insulating film 236, a seventh interlayer insulating film 237, and an eighth interlayer insulating film 238.

The first interlayer insulating film 231 is disposed on the insulating layer 20. The TFT 25 is disposed on the first interlayer insulating film 231. The TFT 25 includes a semiconductor layer 250, a gate electrode 251 and a gate insulating film 252. The semiconductor layer 250 is disposed on the first interlayer insulating film 231 in contact with the first interlayer insulating film 231. The gate insulating film 252 is interposed between the semiconductor layer 250 and the gate electrode 251.

The semiconductor layer 250 has a channel area 2501, a source area 2502, a drain area 2503, a first LDD area 2504, and a second LDD area 2505. The channel area 2501 is located between the source area 2502 and the drain area 2503. The channel area 2501 overlaps with the gate electrode 251 in plan view. The first LDD area 2504 is located between the channel area 2501 and the source area 2502. The second LDD area 2505 is located between the channel area 2501 and the drain area 2503. Note that at least one of the first LDD area 2504 and the second LDD area 2505, particularly the first LDD area 2504, may be omitted. The semiconductor layer 250 is formed by, for example, depositing polysilicon. Dopants for enhancing conductivity are injected into areas of the semiconductor layer 250 excluding the channel area 2501. Concentration of the dopant in the first LDD area 2504 is lower than concentration of the dopant in the source area 2502. Concentration of the dopant in the second LDD area 2505 is lower than concentration of the dopant in the drain area 2503.

The second interlayer insulating film 232 is disposed on the semiconductor layer 250. The third interlayer insulating film 233 is disposed over the second interlayer insulating film 232 so as to cover the gate electrode 251. The scanning lines 261 are disposed on the third interlayer insulating film 233. A contact portion 241 that electrically couples the scanning lines 261 and the gate electrode 251 is disposed on the third interlayer insulating film 233. The fourth interlayer insulating film 234 is disposed on the scanning lines 261. The capacitance lines 263 are disposed on the fourth interlayer insulating film 234. The fifth interlayer insulating film 235 is disposed on the capacitance lines 263.

The storage capacitor 264 includes a first capacitor 2641 and a second capacitor 2642. The first capacitor 2641 is disposed on the fifth interlayer insulating film 235. The sixth interlayer insulating film 236 is disposed on the first capacitor 2641. The second capacitor 2642 is disposed on the sixth interlayer insulating film 236. Further, a contact portion 242 that electrically couples the first capacitor 2641 and the second capacitor 2642 is disposed on the sixth interlayer insulating film 236. Although not illustrated in detail, the first capacitor 2641 and the second capacitor 2642 are each constituted by two capacitance electrodes and a dielectric body disposed between the capacitance electrodes.

A contact portion 243 that electrically couples the first capacitor 2641 and the capacitance lines 263 is disposed on the fifth interlayer insulating film 235. A contact portion 244 that electrically couples the second capacitor 2642 and the drain area 2503 is disposed across the second to sixth interlayer insulating films 232 to 236. The drain area 2503 is electrically coupled to the pixel electrodes 28 via the contact portion 244, the storage capacitor 264 and contacts that are not illustrated, as well other components.

The seventh interlayer insulating film 237 is disposed on the second capacitor 2642. The signal line 262 is disposed on the seventh interlayer insulating film 237. Although not illustrated in detail, an intersection at which the signal lines 262 and the scanning lines 261 intersect in plan view overlaps with the TFT 25. A contact portion 245 that electrically couples the signal lines 262 and the source area 2502 is disposed across the second to seventh interlayer insulating films 232 to 237. The eighth interlayer insulating film 238 is disposed over the seventh interlayer insulating film 237 so as to cover the signal lines 262. The pixel electrodes 28 are disposed on the eighth interlayer insulating film 238. One pixel electrode 28 overlaps with one light-transmissive area A11 in plan view.

The first to eighth interlayer insulating films 231 to 238 are formed using, for example, a silicon-based inorganic compound. More specifically, the first to eighth interlayer insulating films 231 to 238 are formed of a thermal silicon oxide film or a silicon oxide film formed by a vapor deposition method such as chemical vapor deposition (CVD), for example. Additionally, examples of the materials used to form the capacitance electrodes in the gate electrode 251, the scanning lines 261, the signal lines 262, the capacitance lines 263, and the storage capacitor 264 include conductive materials among polysilicons, metals, metal silicides, and metal compounds. The materials used to form each of the contact portions 241 to 245 described above are also electrically conductive materials.

1-1d. Light-Shielding Body 30 and Insulating Layer 20 of Element Substrate 2

Figure 5:
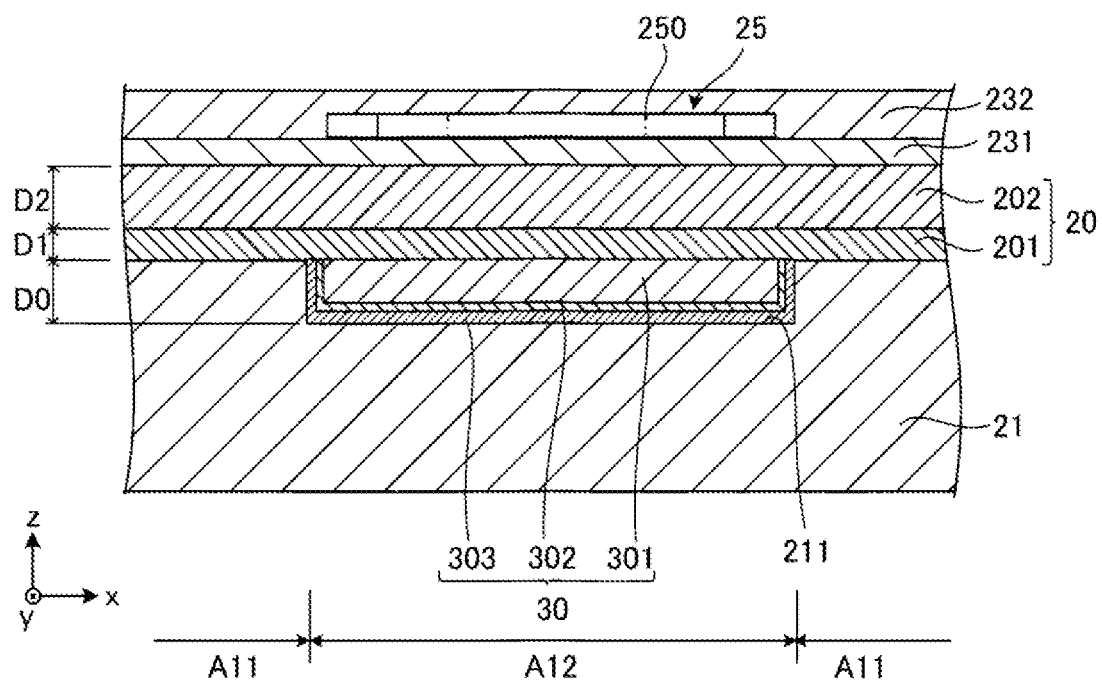
FIG. 5 is a cross-sectional view illustrating a light-shielding body and an insulating layer according to the first embodiment.
Figure 6:
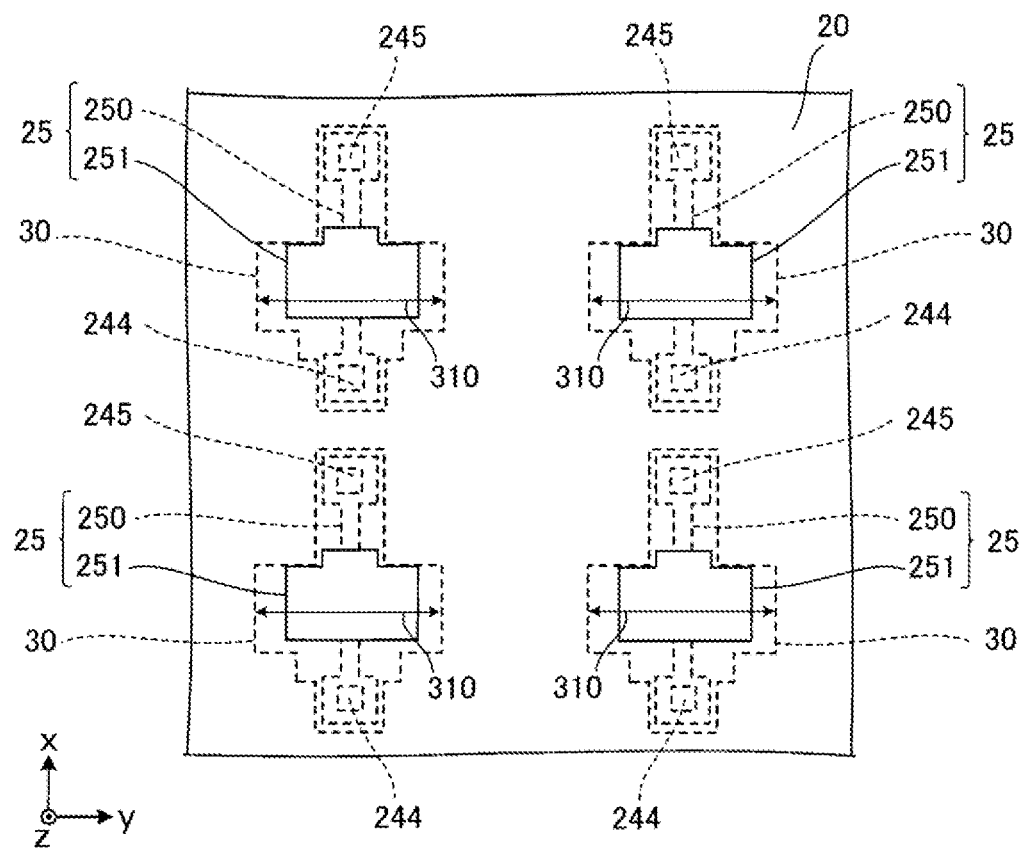
FIG. 6 is a plan view illustrating the light-shielding body and a TFT according to the first embodiment.

FIG. 5 is a cross-sectional view illustrating the light-shielding body 30 and the insulating layer 20 according to the first embodiment. FIG. 6 is a plan view illustrating the light-shielding body 30 and the TFT 25 according to the first embodiment. As illustrated in FIG. 5, a plurality of recessed portions 211 are formed in the surface of the first base 21 on the +z-axis side. Each recessed portion 211 is a depression formed in the front surface of the first base 21 on the +z side. In the present embodiment, the bottom surface of each recessed portion 211 is a continuous flat surface with no raised sections along the x-y plane.

The light-shielding body 30 is disposed within the recessed portion 211. In other words, the light-shielding body 30 is disposed between the first base 21 and the TFT 25. The light-shielding body 30 includes a metal and has light-shielding properties. In the following description, "light-shielding property" refers to the property of shielding visible light, and more specifically means that transmittance of visible light is less than or equal to 10%, preferably less than or equal to 5%. The light-shielding body 30 is electrically conductive. In the present embodiment, the light-shielding body 30 is insulated from various wires such as the TFT 25.

As illustrated in FIG. 6, the light-shielding bodies 30 are arranged in a matrix in the x-direction and the y-direction in plan view. The light-shielding bodies 30 overlap with the TFT 25 in plan view. One light-shielding body 30 is disposed for one TFT 25. In the figures, the light-shielding body 30 has a rectangular shape extending in the x-axis direction in plan view. The light-shielding body 30 has a wide portion 310 that is wider in the longitudinal direction of the light-shielding body 30 than at either end of the light-shielding body 30 in the longitudinal direction. The wide portion 310 overlaps with the gate electrode 251 of the TFT 25 in plan view. As illustrated in FIG. 5, a thickness D0 of the light-shielding body 30 is constant. The thickness D0 is the length along the z-axis direction.

The light-shielding body 30 is formed of three layers including a metal. When the light-shielding body 30 includes a metal, a light-shielding body 30 having excellent dimensional accuracy and excellent light-shielding properties can be easily formed. More specifically, the light-shielding body 30 includes a first metal film 301, a second metal film 302 and a third metal film 303. The third metal film 303 is disposed on the first base 21. The second metal film 302 is disposed on the third metal film 303. The first metal film 301 is disposed on the second metal film 302. In other words, the third metal film 303, the second metal film 302 and the first metal film 301 are layered on top of each other in this order on the first base 21.

The third metal film 303 is made of tungsten silicide, for example. The second metal film 302 is made of, for example, tungsten nitride (WN) or titanium nitride (TiN). The first metal film 301 is made of tungsten, for example. Tungsten is one metal that has excellent heat resistance and an optical density (OD) value does not easily decrease even when performing heat treatment during manufacturing, for example. Thus, forming the first metal film 301 of tungsten makes it possible to increase the light-shielding properties of the light-shielding body 30.

Because the light-shielding body 30 includes the second metal film 302 and the third metal film 303, adhesion between the first base 21 and the light-shielding body 30 can be made higher than when the light-shielding body 30 does not include the second metal film 302 and the third metal film 303. Providing the third metal film 303 is particularly important because the third metal film 303 includes silicon atoms and thus provides excellent adhesion to the first base 21 made of a silicon-based inorganic compound. As a result, providing the third metal film 303 can particularly enhance adhesion between the light-shielding body 30 and the first base 21.

Further, tungsten silicide is more likely to decrease in OD value than tungsten when heat treatment is performed. Therefore, if the third metal film 303 and the first metal film 301 are in direct contact, the OD value of the first metal film 301 may decrease due to the tungsten silicide contained in the third metal film 303. In the light-shielding body 30, the second metal film 302 is disposed between the third metal film 303 and the first metal film 301. Thus, a reduction in the OD value of the first metal film 301 due to tungsten silicide can be suppressed.

Note that the second metal film 302 may have either a configuration including both tungsten nitride and titanium nitride, or a stacked structure formed by stacking metal nitride film including tungsten nitride and metal nitride film including titanium nitride. The number of layers constituting the light-shielding body 30 is not limited to three and may one layer, or a plurality of layers other than three. One or both of the second metal film 302 and the third metal film 303 may be omitted. Further, the first metal film 301, the second metal film 302 and the third metal film 303 may each be formed of a material other than the metals described above. The light-shielding body 30 may be made of a metal such as titanium, tantalum, cobalt or nickel, a compound material containing these metals, or a mixed material formed by mixing at least two of the metals.

The third metal film 303 is thicker than the second metal film 302 and thinner than the first metal film 301. By making the first metal film 301 the thickest film, light-shielding properties of the light-shielding body 30 can be increased. In addition, because the third metal film 303 is thicker than the second metal film 302, the light-shielding body 30 can more easily adhere to the first base 21 than when the third metal film 303 is thinner than the second metal film 302.

As illustrated in FIG. 5, the insulating layer 20 covering the light-shielding body 30 is disposed on the first base 21. The insulating layer 20 includes a first insulating layer 201 and a second insulating layer 202. The first insulating layer 201 is disposed between the light-shielding body 30 and the TFT 25 in contact with the light-shielding body 30. The second insulating layer 202 is disposed between the first insulating layer 201 and the TFT 25 in contact with the first insulating layer 201. The first insulating layer 201 has a thickness D1 smaller than a thickness D2 of the second insulating layer 202.

The first insulating layer 201 and the second insulating layer 202 both have translucent and insulating properties. The main components that make up the first insulating layer 201 and the second insulating layer 202 are, for example, a resin material or a silicon-based inorganic material. Of these materials, the main component of the first insulating layer 201 and the second insulating layer 202 is preferably silicon oxide or a translucent silicon-based inorganic material such as silicon oxynitride, more preferably silicon oxide. Using a translucent silicon-based inorganic material for the first insulating layer 201 makes it possible to form a first insulating layer 201 that is substantially thin and has excellent translucency compared to when the first insulating layer 201 is made of a resin material. The same applies to the second insulating layer 202. In addition, using silicon oxide for the first insulating layer 201 affords the first insulating layer 201 higher translucency than when the first insulating layer 201 is made of silicon oxynitride. As a result, the optical properties of the element substrate 2 can be improved. The same applies to the second insulating layer 202.

The main component of the first insulating layer 201 is the material that makes up the majority of the first insulating layer 201. Similarly, the main component of the second insulating layer 202 is the material that makes up the majority of the second insulating layer 202. The main component of the first insulating layer 201 and the main component of the second insulating layer 202 may be different from each other, but using the same material is preferable. Using the same material can reduce interface reflection further than if different materials are used.

The first insulating layer 201 includes a predetermined element that is different to the element of the main component of the first insulating layer 201. The predetermined element is an element included at 0.1 mass % or less in the first insulating layer 201. The same applies to the second insulating layer 202. The predetermined element is included during, for example, a manufacturing step of the element substrate 2. The second insulating layer 202 may include the predetermined element at a content smaller than the content of the predetermined element in the first insulating layer 201, or may not include the predetermined element. In other words, the content of the predetermined element in the first insulating layer 201 is greater than the content of the predetermined element in the second insulating layer 202. Further, the second insulating layer 202 is disposed between the first insulating layer 201 and the TFT 25 in contact with the first insulating layer 201. Thus, the first insulating layer 201 is not in contact with the TFT 25 when the second insulating layer 202 is provided. By disposing the second insulating layer 202 between the first insulating layer 201 and the TFT 25, the effect of the predetermined element on the TFT 25 can be reduced further than when the first insulating layer 201 is in contact with the TFT 25. Note that a method for manufacturing the element substrate 2 and the influence of the predetermined element on the properties of the TFT 25 will be described in detail below.

Specifically, the predetermined element is fluorine or boron. These elements are particularly likely to affect the properties of the TFT 25. As a result, setting the content of the predetermined element in the second insulating layer 202 to less than in the first insulating layer 201 can particularly reduce the effect of the predetermined element on the properties of the TFT 25. Note that these elements are, for example, elements included in film forming gas or the like for forming the light-shielding body 30 and are easy to introduce when manufacturing the light-shielding body 30. The type of the predetermined element included in the first insulating layer 201 and the second insulating layer 202 varies depending on the film forming gas or the like that is used.

1-1e. Method for Manufacturing Electro-Optical Device 100

Figure 7:
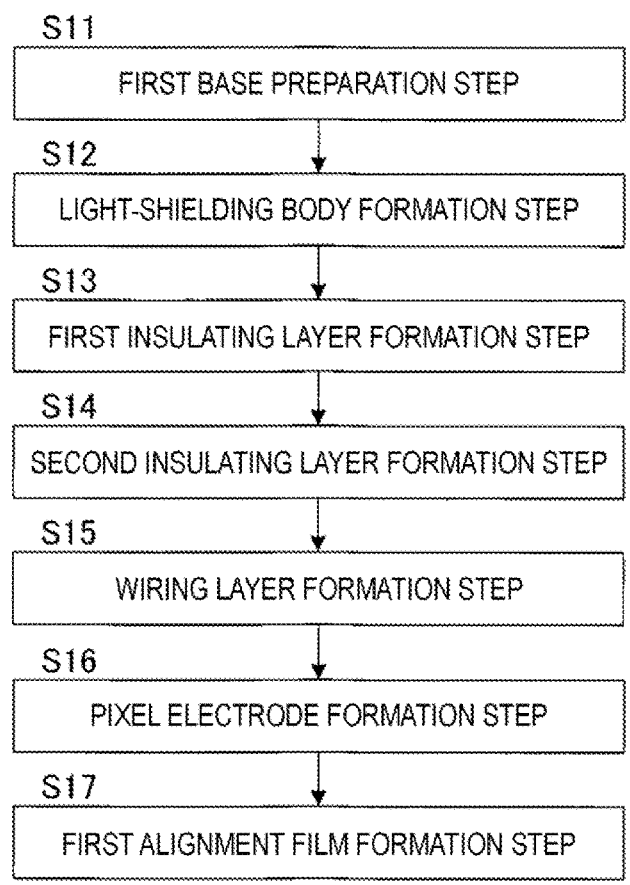
FIG. 7 is a flowchart illustrating a method for manufacturing the element substrate according to the first embodiment.

Next, a method for manufacturing the electro-optical device 100 will be described. First, a method for manufacturing the element substrate 2 in the electro-optical device 100 will be described. FIG. 7 is a flowchart illustrating the method for manufacturing the element substrate 2 according to the first embodiment.

As illustrated in FIG. 7, the method for manufacturing the element substrate 2 includes a first base preparation step S11, a light-shielding body formation step S12, a first insulating layer formation step S13, a second insulating layer formation step S14, a wiring layer formation step S15, a pixel electrode formation step S16 and a first alignment film formation step S17. The element substrate 2 is manufactured by sequentially performing each of the steps.

Figure 8:
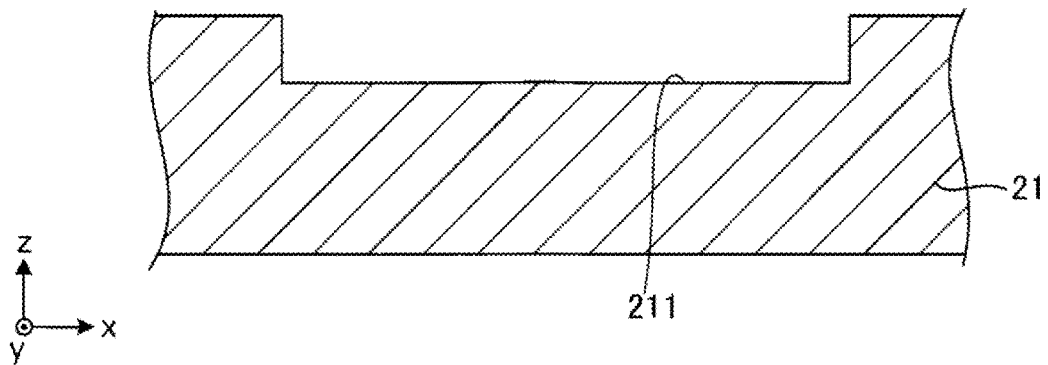
FIG. 8 is a cross-sectional view for explaining a first base preparation step according to the first embodiment.

FIG. 8 is a cross-sectional view for explaining the first base preparation step S11 according to the first embodiment. In the first base preparation step S11, the recessed portions 211 are formed in, for example, a quartz substrate to form the first base 21 illustrated in FIG. 8. As a result, the first base 21 is prepared.

Figure 9:
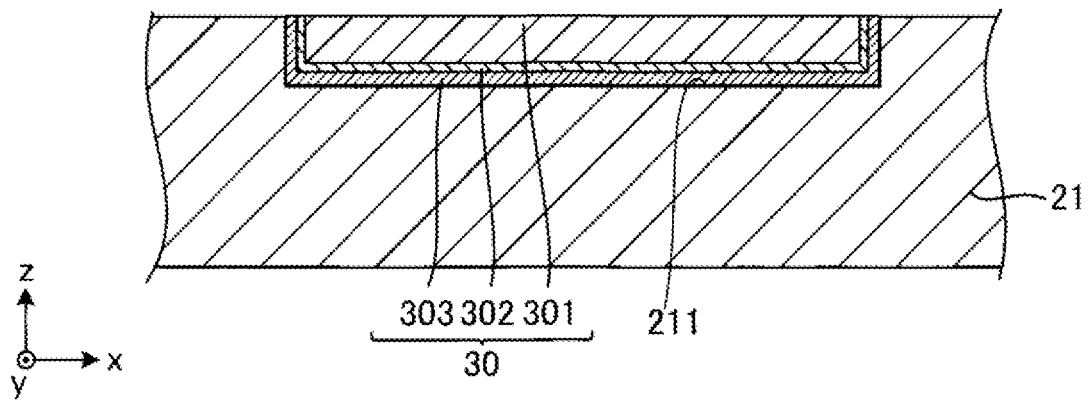
FIG. 9 is a cross-sectional view for explaining a light-shielding body formation step according to the first embodiment.

FIG. 9 is a cross-sectional view for explaining the light-shielding body formation step S12 according to the first embodiment. In the light-shielding body formation step S12, the light-shielding body 30 illustrated in FIG. 9 is formed. More specifically, the third metal film 303 is formed by depositing a composition for forming a tungsten silicide film in the recessed portion 211 by a vapor deposition method, for example, chemical vapor deposition (CVD). The second metal film 302 is formed in a similar manner by depositing a composition including, for example, tungsten nitride or titanium nitride on the third metal film 303. The first metal film 301 is formed in a similar manner by depositing a composition including, for example, tungsten on the second metal film 302.

When each layer of the light-shielding body 30 is formed by CVD, various types of gases including a metal such as tungsten, hydrogen ($H_2$), silane ($SiH_4$), ammonia ($NH_3$) diborane ($B_2H_6$) are used. For example, if the first metal film 301 includes tungsten, the first metal film 301 is formed using, for example, tungsten hexafluoride ($WF_6$) gas and hydrogen gas. When adopting this formation method, the first metal film 301 includes fluorine (F) as the predetermined element in addition to tungsten (W) as the element of the main component of the first metal film 301.

Performing a polishing flattening process such as chemical mechanical polishing (CMP) flattens the surface of the light-shielding body 30 on the +z-axis side and the surface of the first base 21 on the +z-axis side. Performing flattening can eliminate the raised section at the boundary between the surface of the light-shielding body 30 on the +z-axis side and the surface of the first base 21 on the +z-axis side.

Figure 10:
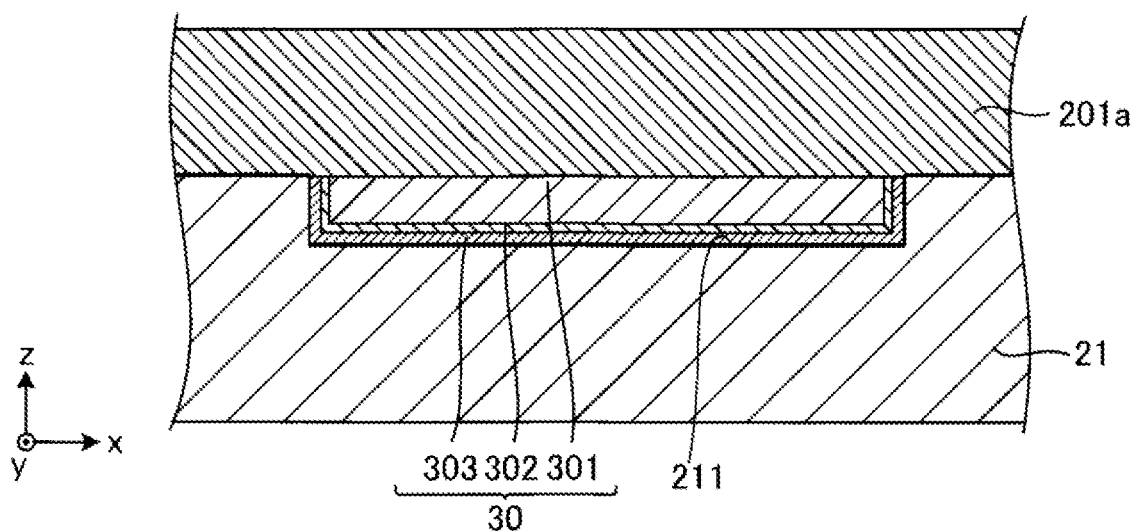
FIG. 10 is a cross-sectional view for explaining a first insulating layer formation step according to the first embodiment.
Figure 11:
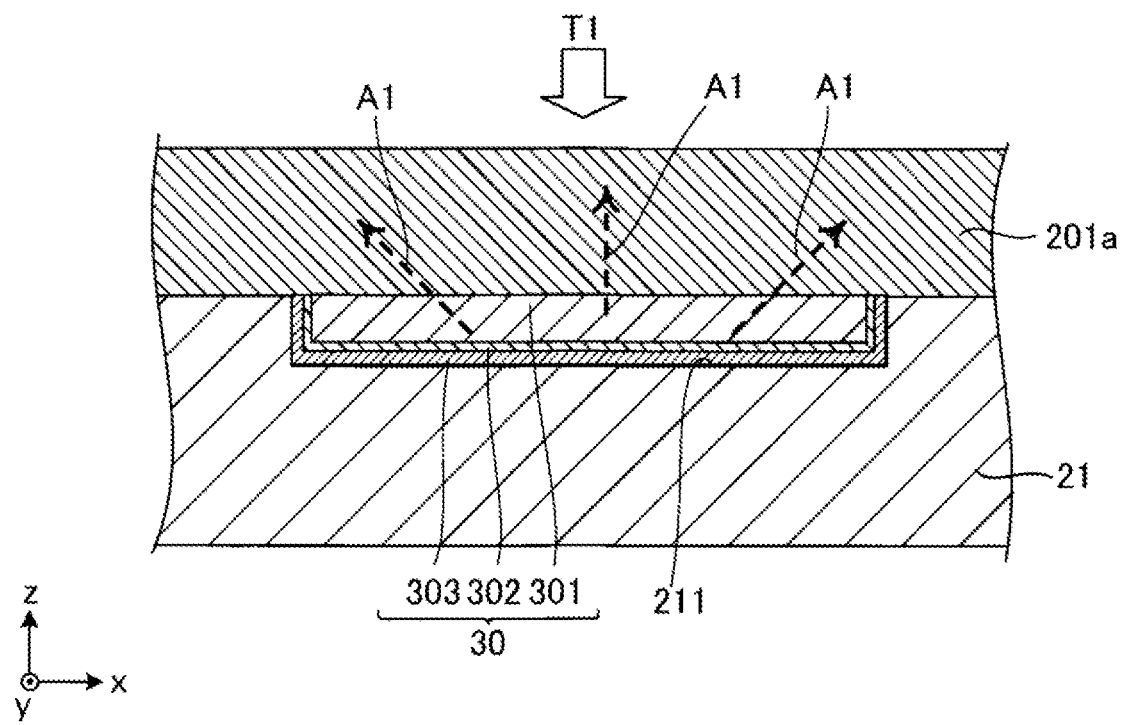
FIG. 11 is a cross-sectional view for explaining the first insulating layer formation step according to the first embodiment.
Figure 12:
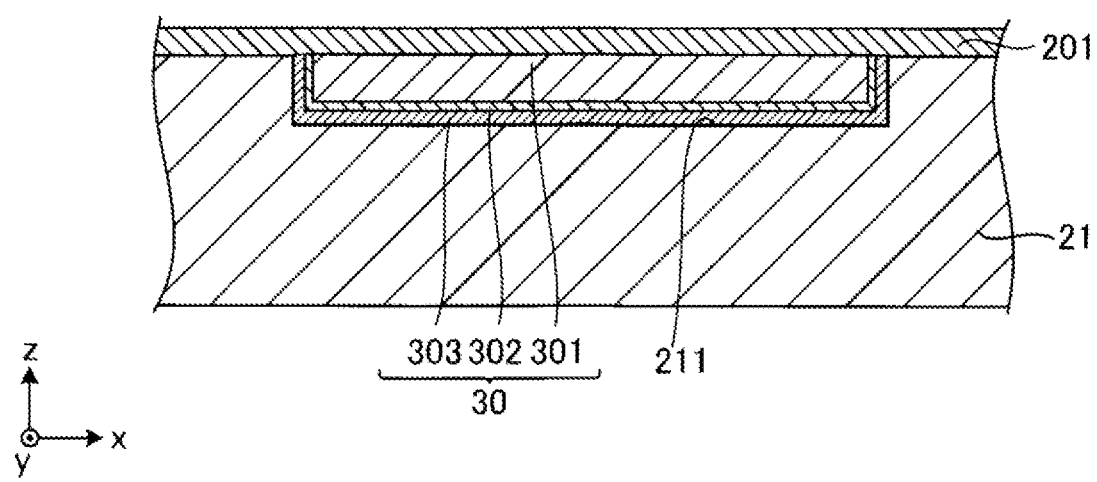
FIG. 12 is a cross-sectional view for explaining the first insulating layer formation step according to the first embodiment.

FIGS. 10, 11 and 12 are cross-sectional views for explaining the first insulating layer formation step S13 according to the first embodiment. As illustrated in FIG. 10, in the first insulating layer formation step S13, an insulating layer 201a is first formed on the first base 21 by a vapor deposition method, for example, CVD. The insulating layer 201a is in contact with the light-shielding body 30 and covers the light-shielding body 30. Note that the insulating layer 201a is an element used for forming the first insulating layer 201. When the insulating layer 201a includes silicon oxide, a gas including tetraethyl orthosilicate (TEOS), for example, is used in forming the insulating layer 201a.

Next, as illustrated in FIG. 11, annealing for applying heat at a first temperature T1 is performed on the insulating film 201a. By performing annealing, the predetermined element included in the light-shielding body 30 diffuses into the insulating film 201a as indicated by the arrows A1. In other words, the predetermined element in the light-shielding body 30 is intentionally diffused into the insulating film 201a through annealing. When the insulating film 201a mainly contains silicon oxide, the first temperature T1 is preferably 900° C. or higher, for example. Within such a range, a decrease in the transluency of the insulating film 201a can be suppressed, and the predetermined element in the light-shielding body 30 can be particularly effectively diffused into the insulating film 201a in a short amount of time.

Next, as illustrated in FIG. 12, a removal process is performed in which a portion of the insulating film 201a is removed. The first insulating layer 201 is formed by removing a portion of the insulating film 201a. In other words, the first insulating layer 201 is formed by reducing the thickness of the insulating film 201a. Therefore, the total content of the predetermined element in the first insulating layer 201 can be reduced further than the total content of the predetermined element in the insulating film 201a. Note that the portion of the insulating film 201a is removed by polishing, for example, performing CMP.

Figure 13:
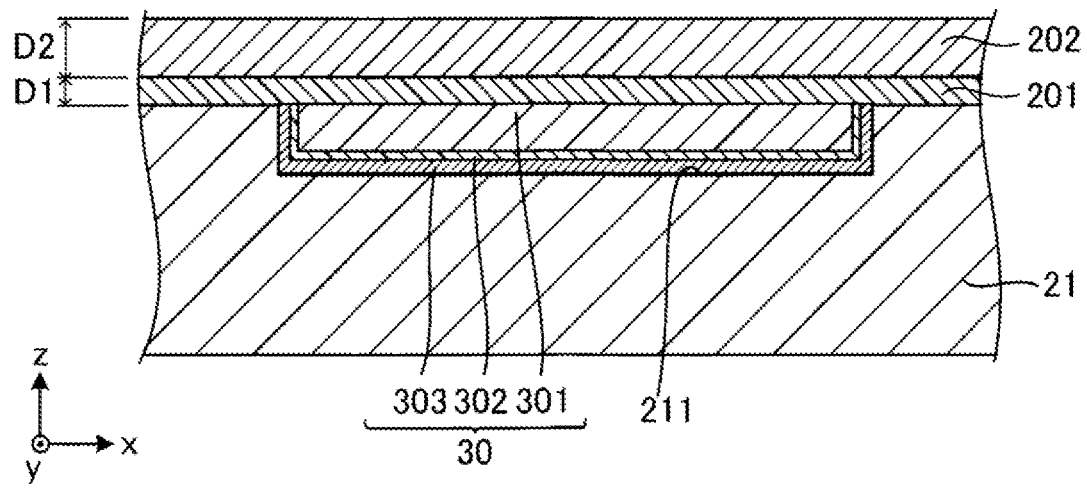
FIG. 13 is a cross-sectional view for explaining a second insulating layer formation step according to the first embodiment.
Figure 14:
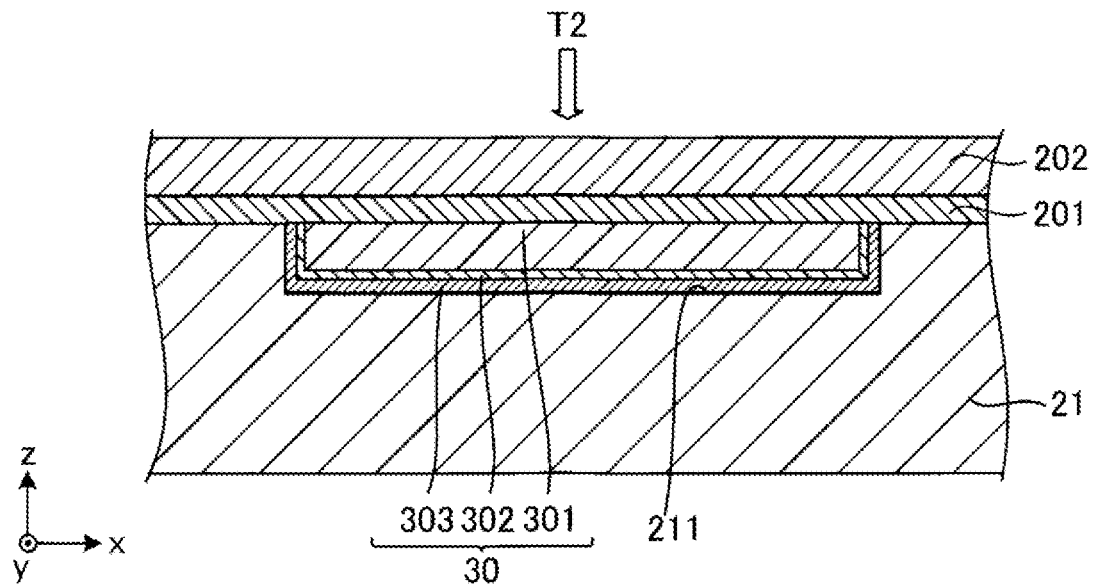
FIG. 14 is a cross-sectional view for explaining the second insulating layer formation step according to the first embodiment.

FIGS. 13 and 14 are cross-sectional views for explaining the second insulating layer formation step S14 according to the first embodiment. In the second insulating layer formation step S14, first, as illustrated in FIG. 13, the second insulating layer 202 is formed on the first insulating layer 201 by a vapor deposition method such as CVD. The second insulating layer 202 is formed such that the thickness D2 of the second insulating layer 202 is greater than the thickness D1 of the light-shielding body 30. When the second insulating layer 202 includes silicon oxide, a gas including tetraethyl orthosilicate (TEOS), for example, is used in forming the second insulating layer 202. Further, when forming the second insulating layer 202, it is preferable to appropriately change the gas used, manufacturing conditions, and other factors such that the second insulating layer 202 is formed with higher purity than the first insulating layer 201. For example, plasma CVD using silane ($SiH_4$) and $O_2$ gas, or a thermal oxidation process using $SiO_2+N_2O$ can be used.

Next, as illustrated in FIG. 14, annealing for applying heat at a second temperature T2 is performed on the second insulating layer 202. By performing annealing, residual stress in the second insulating layer 202 can be effectively removed. As a result, strain and the like in the second insulating layer 202 can be suppressed. When performing annealing, the second temperature T2 is preferably lower than the first temperature T1 described above. When the second insulating layer 202 mainly contains silicon oxide, the second temperature T2 is preferably 700° C. or higher, for example.

The time required for annealing in the second insulating layer formation step S14 is preferably equal to or shorter than the time required for annealing in the first insulating layer formation step S13. When the annealing times are set to have such a relationship, the predetermined element in the first insulating layer 201 can be diffused more effectively, and strain and the like in the second insulating layer 202 can be suppressed.

Figure 15:
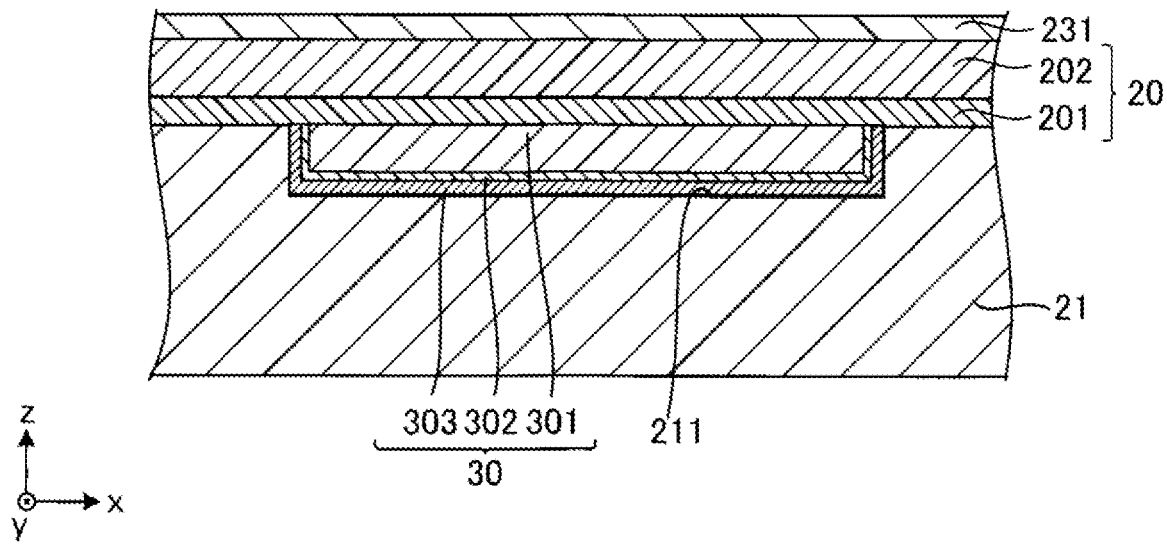
FIG. 15 is a cross-sectional view for explaining a wiring layer formation step according to the first embodiment.
Figure 16:
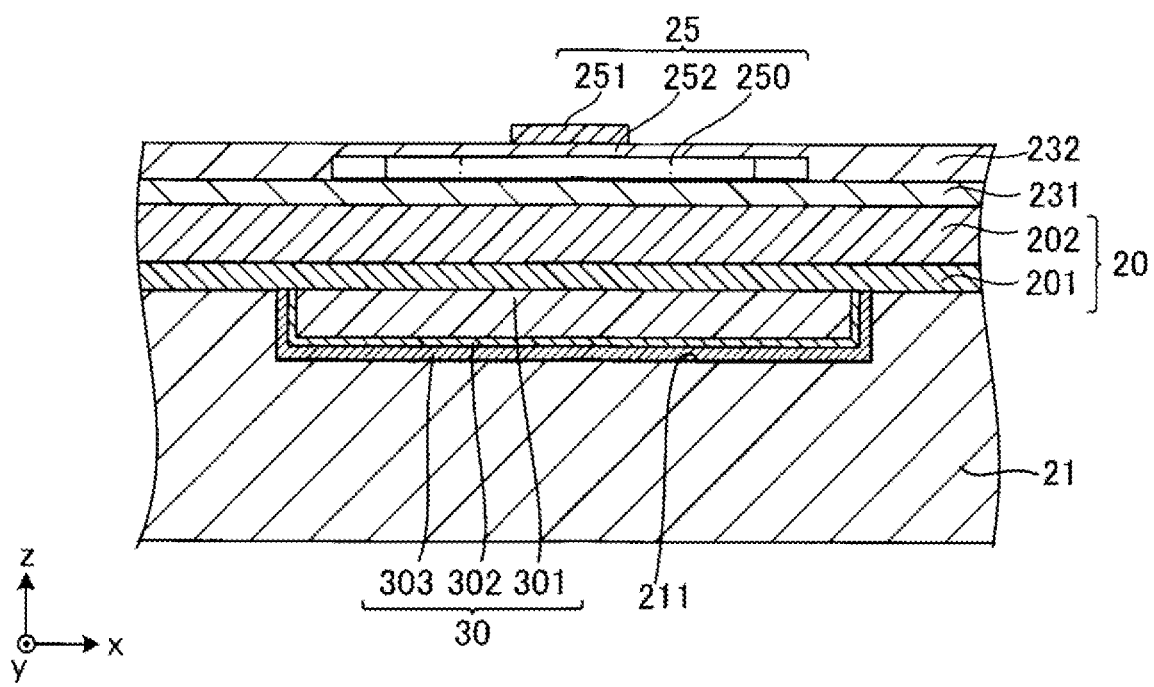
FIG. 16 is a cross-sectional view for explaining the wiring layer formation step according to the first embodiment.

FIGS. 15 and 16 are cross-sectional views for explaining the wiring layer formation step S15 according to the first embodiment. In the wiring layer formation step S15, the insulating body 23 and various wiring for the TFT 25, the scanning lines 261, the capacitance lines 263, the signal lines 262, and the storage capacitor 264 are formed. First, as illustrated in FIG. 15, the first interlayer insulating film 231 of the insulator 23 is formed on the second insulating layer 202. The first interlayer insulating film 231 is formed using a vapor deposition method such as CVD and flattening through, for example, polishing such as CMP.

Then, as illustrated in FIG. 16, the TFT 25 is formed. First, for example, a polysilicon film is formed by annealing an amorphous silicon film, and the gate insulating film 252 and the gate electrode 251 are formed on the polysilicon film. Then, the semiconductor layer 250 is formed by implanting dopants into the polysilicon film. Annealing is performed when forming the TFT 25 in order to, for example, activate dopants and improve the film quality of the semiconductor layer 250.

Note that the gate electrode 251 is formed by, for example, forming a metal film by a sputtering method or a vapor deposition method and performing etching using a resist mask on the metal film. In addition, although not illustrated, a method similar to that used to manufacture the gate electrode 251 can be used as a method for manufacturing the various types of wiring formed on the TFT 25. Each layer in the insulating body 23 other than the first interlayer insulating film 231 is formed using a vapor deposition method such as CVD and flattening by, for example, polishing such as CMP.

Next, in the pixel electrode formation step S16, although not illustrated, the plurality of pixel electrodes 28 are formed on the wiring layer 26 in the display area A10. More specifically, the pixel electrodes 28 are formed by forming a layer made of, for example, a translucent electrode material using a vapor deposition method such as CVD and then patterning the layer using a mask.

Next, in the alignment film formation step S17, the first alignment film 29 is formed by forming a layer made of, for example, polyimide using a vapor deposition method such as CVD and then performing a rubbing treatment on the layer.

Note that various circuits and other components, such as the scanning line driver circuit 11 illustrated in FIG. 1, are formed when appropriate between the aforementioned steps or steps. For example, the counter substrate 4 is formed using appropriate known techniques, and the element substrate 2 and the counter substrate 4 are bonded together using the seal portion 8. Then, a liquid crystal material is injected between the element substrate 2, the counter substrate 4, and the seal portion 8 to form the liquid crystal layer 9, and then the layer is sealed. In such a manner, the electro-optical device 100 illustrated in FIGS. 1 and 2 can be manufactured.

As described above, the method for manufacturing the electro-optical device 100 includes the first base preparation step S11, the light-shielding body formation step S12, the first insulating layer formation step S13, the second insulating layer formation step S14, and the wiring layer formation step S15. In the light-shielding body formation step S12, the light-shielding body 30 including a metal is formed on the first base 21. In the first insulating layer formation step S13, the insulating first insulating layer 201 in contact with the light-shielding body 30 is formed on the light-shielding body 30. In the second insulating layer formation step S14, the insulating second insulating layer 202 in contact with the first insulating layer 201 is formed on the first insulating layer 201. In the wiring layer formation step S15, the TFT 25 is formed on the second insulating layer 202. The first insulating layer 201 and the second insulating layer 202 are formed such that the content of the predetermined element other than the element making up the main component of the first insulating layer 201 is greater than the content of the predetermined element in the second insulating layer 202. Because the content of the predetermined element in the first insulating layer 201 is greater than the content of the predetermined element in the second insulating layer 202, it is possible to suppress a decrease in properties of the TFT 25 due to the influence of the predetermined element.

Figure 17:
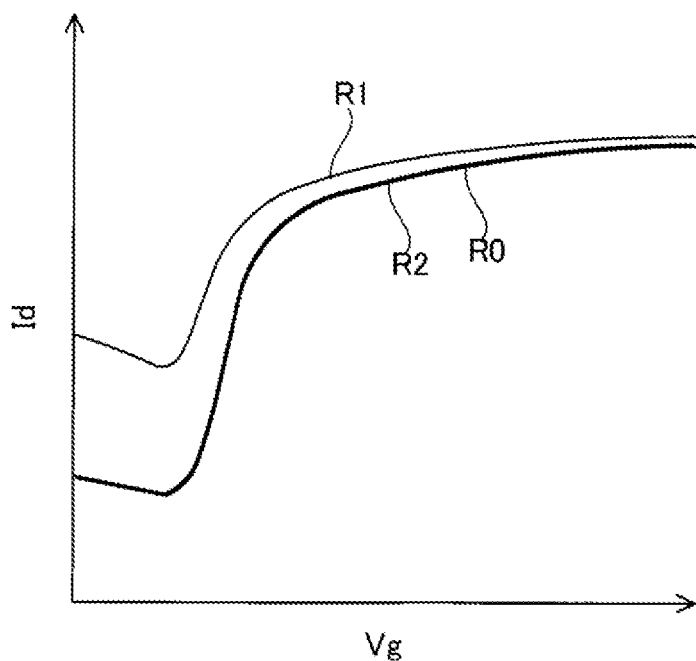
FIG. 17 is a graph showing properties of the TFT according to the first embodiment.

FIG. 17 is a graph showing properties of the TFT 25 according to the first embodiment. In FIG. 17, the vertical axis indicates a drain current value Id and the horizontal axis indicates a gade voltage Vg. A line segment R0 is a reference result of properties of the TFT 25 when a light-shielding film 40 is not provided. A line segment R1 is the result of properties of the TFT 25 when the second insulating layer 202 is not provided and the first insulating layer 201 and the TFT 25 are in contact with each other. A line segment R2 is the result of properties of the TFT 25 when the second insulating layer 202 is provided.

When comparing the line segment R1 to the line segment R0, it is evident that the ratio of an on current to an off current when the first insulating layer 201 and the TFT 25 are in contact with each other is lower than the same ratio in the reference result. On the other hand, the line segment R2 and the line segment R0 are substantially identical. When comparing the line segment R2 to the line segment R0, it is evident that the ratio of the on current to the off current when the second insulating layer 202 is provided is equivalent to the same ratio in the reference result. Note that, as evident when comparing the line segment R1 and the line segment R2, the ratio between the on current and the off current when the second insulating layer 202 is provided is higher than the ratio when the first insulating layer 201 and the TFT 25 are in contact with each other.

As can be seen from FIG. 17, when the TFT 25 is formed on the first insulating layer 201 in which the predetermined element in the light-shielding body 30 has been diffused, the predetermined element in the first insulating layer 201 adversely affects the switching function of the TFT 25. This is believed to be because the predetermined element diffused by annealing when forming the TFT 25 affect channels in the TFT 25. In contrast, the reduction in switching function of the TFT 25 due to the predetermined element can be suppressed by providing the second insulating layer 202 in which the content of the predetermined element is less than in the first insulating layer 201.

Providing the second insulating layer 202 in which the content of the predetermined element is less than in the first insulating layer 201 also makes it possible to suppress diffusion of the predetermined element in the first insulating layer 201 to the semiconductor layer 250 during the annealing process and the deposition process performed after the second insulating layer formation step S14. Therefore, reduction in the properties of the TFT 25 can be particularly effectively suppressed.

As described above, annealing is performed at the first temperature T1 in the first insulating layer formation step S13 and annealing is performed at the second temperature T2 that is lower than the first temperature T1 in the second insulating layer formation step S14. By setting the first temperature T1 higher than the second temperature T2, the predetermined element in the light-shielding body 30 can be effectively diffused into the insulating film 201a. As a result, the predetermined element in the light-shielding body 30 can be prevented from diffusing to the second insulating layer 202 due to annealing at the time of forming the second insulating layer 202. The difference between the first temperature Tl and the second temperature T2 is preferably between 100° C. and 300° C. When the difference between the two temperatures is within this range, the predetermined element can be particularly effectively suppressed from diffusing into the second insulating layer 202 due to annealing at the time of forming the second insulating layer 202, and strain in the first insulating layer 201 and the second insulating layer 202 can be particularly effectively suppressed. Furthermore, the difference between the first temperature T1 and the second temperature T2 may be between 0° C. and 300° C. If the difference between the first temperature T1 and the second temperature T2 is small, shortening the annealing process at the second temperature T2 makes it possible to particularly effectively suppress diffusion of the predetermined element into the second insulating layer 202 due to annealing at the time of forming the second insulating layer 202 and strain in the first insulating layer 201 and the second insulating layer 202.

The first temperature T1 is preferably higher than the temperature during the annealing process when forming the TFT 25. When the first temperature T1 is at such a temperature, the predetermined element in the first insulating layer 201 can be suppressed from diffusing into the semiconductor layer 250 due to annealing the TFT 25. As a result, reduction in the properties of the TFT 25 can be particularly effectively suppressed.

As described above, a removal process is performed in the first insulating layer formation step S13. In other words, the first insulating layer 201 is formed by reducing the thickness of the insulating film 201a. Therefore, the total content of the predetermined element in the first insulating layer 201 can be made smaller than the total content of the predetermined element in the insulating film 201a. As a result, even if the predetermined element in the first insulating layer 201 diffuses into the semiconductor layer 250 due to annealing when forming the TFT 25, the amount of the diffused predetermined element can be reduced. As a result, reduction in the properties of the TFT 25 can be suppressed.

1-2. Second Embodiment

Figure 18:
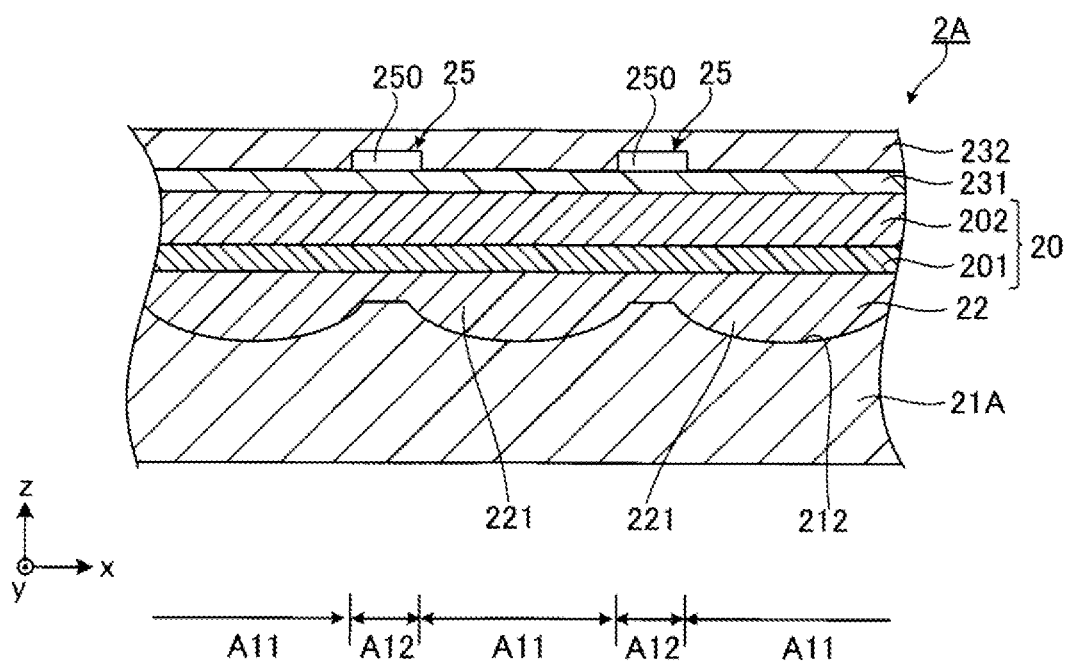
FIG. 18 is a partial cross-sectional view illustrating an element substrate according to a second embodiment.

Next, a second embodiment of the present disclosure will be described. FIG. 18 is a partial cross-sectional view illustrating an element substrate 2A according to the second embodiment. The present embodiment differs from the first embodiment in terms of the configuration of the element substrate 2A. Note that signs used in the description of the first embodiment will be used to denote components of the second embodiment that are the same as those in the first embodiment, and a detailed description of any similar components will be omitted as appropriate.

The element substrate 2A illustrated in FIG. 18 includes a first base 21A and a lens layer 22. A plurality of lens recessed portions 212 are formed in the surface of the first base 21A on the +z axis side.

The lens layer 22 serves as a "material layer" and is disposed between the first base 21A and the first insulating layer 201. The lens layer 22 is in contact with the first base 21A and the first insulating layer 201. The lens layer 22 is made of a silicon-based inorganic material such as silicon oxide or silicon oxynitride. The lens layer 22 also includes a plurality of lenses 221. The lenses 221 are disposed in the lens recessed portions 212. One lens 221 is disposed in one lens recessed portion 212. In addition, one lens 221 overlaps with one light transmission area A11 in plan view. Each lens 221 is comprised of a convex lens with a protruding curved surface protruding toward the first base 21A. Each lens 221 is hemispherical. The lenses 221 are provided such that the light LL can be converged and refracted. With this configuration, light incident on the TFT 25 can be reduced, and hence light utilization efficiency can be improved.

As described above, the element substrate 2A includes the lens layer 22 as a "material layer" containing a silicon-based inorganic material and disposed between the first base 21A and the TFT 25. As in the first embodiment, the content of the predetermined element other than the element that makes up the main component of the first insulating layer 201 is greater than the content of the predetermined element in the second insulating layer 202. As a result, similar to the first embodiment, the second insulating layer 202 is disposed between the first insulating layers 201 and TFT 25 such that it is possible to reduce the effect of the predetermined element on the TFT 25 further than when the first insulating layer 201 is in contact with the TFT 25.

The predetermined element in the first insulating layer 201 formed on the lens layer 22 is, for example, fluorine, boron, or carbon. These elements are elements that are likely to particularly affect the properties of the TFT 25. Therefore, influence of the predetermined element on properties of the TFT 25 can be particularly effectively reduced by setting the content of the predetermined element in the second insulating layer 202 to less than in the first insulating layer 201. Note that these elements are, for example, elements included in a cleaning gas ($NF_3$, CF-type fluorocarbon gas) used in a film forming apparatus and are easily included when forming films for the light shielding body 30. These elements may also be included in an etching solution or an etching gas used to form the lens layer 22. For example, the recessed portions 211 in the element substrate 2A are formed by wet etching with a fluorine-based etching solution such as hydrogen fluoride (HF) or gas etching with a fluorine-based etching gas such as hydrogen fluoride. The lens layer 22 is formed by a vapor deposition method such as, for example, CVD using a gas containing monosilane ($SiH_4$) or tetraethoxysilane (TEOS).

3. Modification Examples

Each of the exemplary embodiments exemplified in the above can be variously modified. Specific modification aspects applied to each of the embodiments described above are exemplified below. Two or more modes freely selected from exemplifications below can be appropriately used in combination as long as mutual contradiction does not arise.

1-3A. First Modification Example

In the second embodiment, a case where the "material layer" is the lens layer 22 is described, but the "material layer" may include a silicon-based inorganic material, and may be formed of, for example, various wiring layers configured to include, for example, polysilicon injected with a dopant. If adopting such a configuration, examples of the "predetermined element" include arsenic (As) and phosphorus (P).

1-3B. Second Modification Example

In each embodiment, the first temperature T1 is higher than the second temperature T2, but the first temperature T1 and the second temperature T2 may be the same temperature, or the second temperature T2 may be higher. In this case, for example, each of the materials constituting the first insulating layer 201 and the second insulating layer 202, the thickness of each of the layers and the annealing time of each of the layers are adjusted so that the content of the predetermined element in the second insulating layer 202 is less than that in the first insulating layer 201.

1-3c. Third Modification Example

In each embodiment, the wiring layer 26 is disposed on the second insulating layer 202 in contact with the second insulating layer 202, but a third insulating layer may be further provided between the second insulating layer 202 and the wiring layer 26.

1-3d. Fourth Modification Example

In each embodiment, the thickness D0 of the light-shielding body 30 is constant, but the thickness D0 may not be constant. For example, a portion of the light-shielding body 30 that overlaps with the channel area 2501 in the TFT 25 in plan view may be thicker than a portion of the light-shielding body 30 that overlaps with the source area 2502 in plan view. Further, shape of the light-shielding body 30 in plan view is not limited to the shape illustrated in FIG. 6. For example, the light-shielding body 30 may not include the wide portion 310. Furthermore, the plurality of light-shielding bodies 30 may be coupled to each other.

1-3e. Fifth Modification Example

In each embodiment, a case where the "transistor" is the TFT 25 is described, but the "transistor" is not limited thereto and may be, for example, a metal-oxide-semiconductor field-effect transistor (MOSFET) or similar component.

2. Electronic Apparatus

The electro-optical device 100 can be used for various electronic apparatuses.

Figure 19:
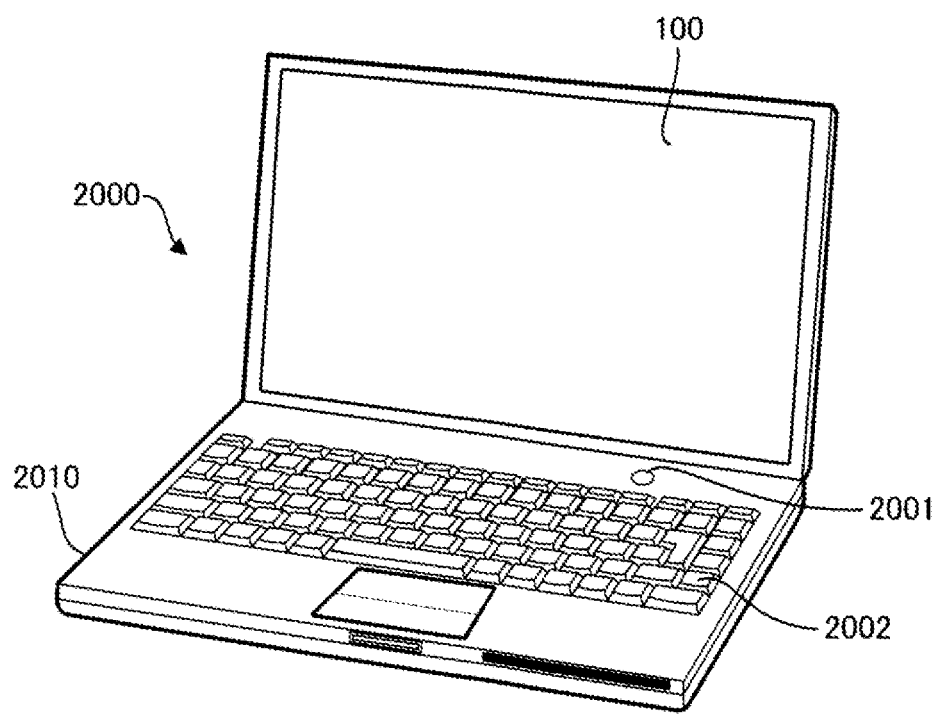
FIG. 19 is a perspective view illustrating a personal computer as an example of an electronic apparatus.

FIG. 19 is a perspective view illustrating a personal computer 2000 as an example of an electronic apparatus. The personal computer 2000 includes the electro-optical device 100 configured to display various images and a main body portion 2010 in which a power supply switch 2001 and a keyboard 2002 are installed.

Figure 20:
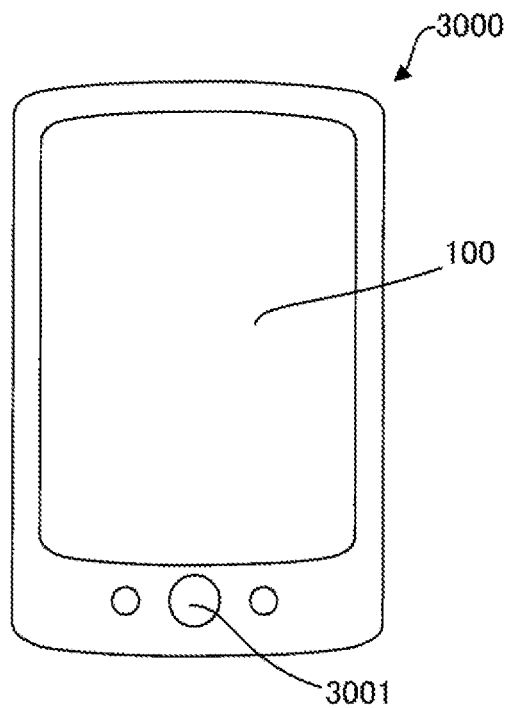
FIG. 20 is a perspective view illustrating a smart phone as an example of an electronic apparatus.

FIG. 20 is a perspective view illustrating a smart phone 3000 as an example of an electronic apparatus. The smart phone 3000 includes operation buttons 3001 and the electro-optical device 100 configured to display various images. The content displayed on the screen of the electro-optical device 100 changes in accordance with the operation of the operation button 3001.

Figure 21:
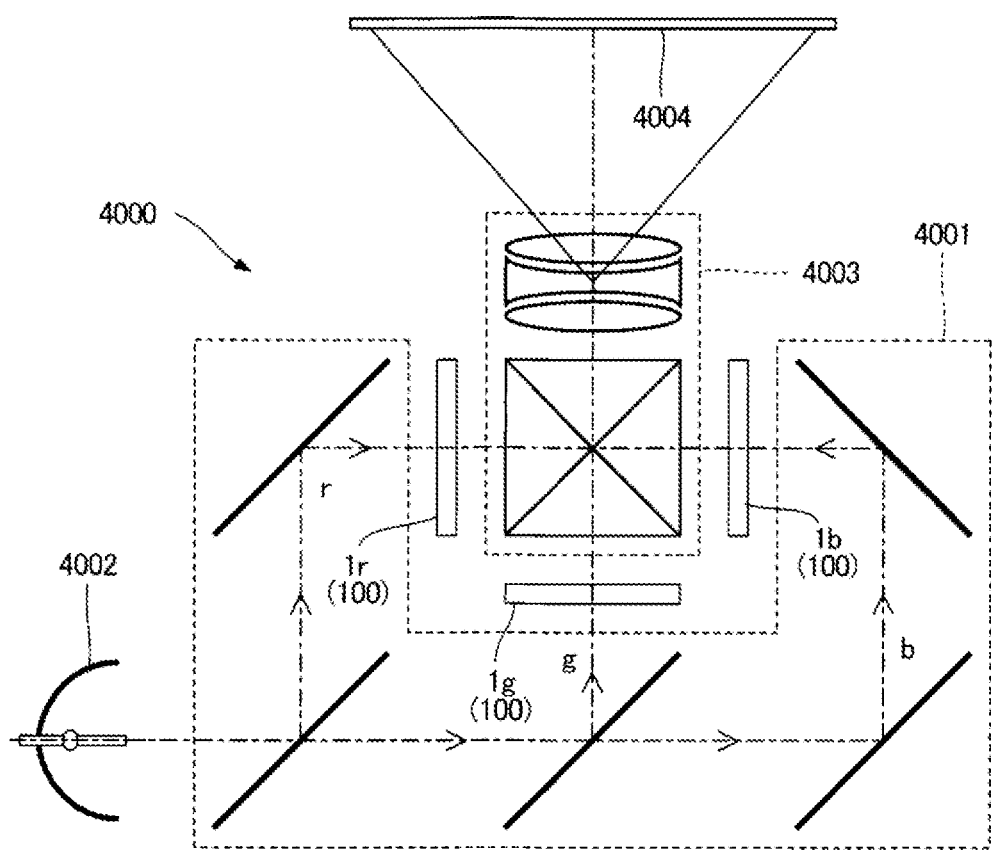
FIG. 21 is a schematic diagram illustrating a projector as an example of an electronic apparatus.

FIG. 21 is a schematic diagram illustrating a projector as an example of an electronic apparatus. A projection-type display device 4000 is a three-plate type projector, for example. An electro-optical device 1r is the electro-optical device 100 corresponding to a red display color, an electro-optical device 1g is the electro-optical device 100 corresponding to a green display color, and an electro-optical device 1b is the electro-optical device 100 corresponding to a blue display color. Specifically, the projection-type display device 4000 includes the three electro-optical devices 1r, 1g and 1b that correspond to display colors of red, green, and blue, respectively.

Among light emitted from an illumination device 4002 serving as a light source, an illumination optical system 4001 supplies a red color component r to the electro-optical device 1r, a green color component g to the electro-optical device 1g, and a blue color component b to the electro-optical device 1b. Each electro-optical device 1r, 1g and 1b functions as an optical modulator, such as a light bulb, that modulates monochromatic light supplied from the illumination optical system 4001 according to display images. A projection optical system 4003 combines the light emitted from each electro-optical device 1r, 1g and 1b and projects the combined light onto a projection surface 4004.

The personal computer 2000, the smart phone 3000 and the projection-type display apparatus 4000 described above each include the above-described electro-optical device 100. With the electro-optical device 100, the quality of display on the personal computer 2000, the smart phone 3000 and the projection-type display apparatus 4000 can be increased.

The present disclosure has been described above based on preferred embodiments, but the present disclosure is not limited to the embodiments described above. In addition, the configuration of each component of the present disclosure may be replaced with any configuration that exerts the equivalent functions of the above-described embodiments, and to which any configuration may be added.

The electronic apparatus to which the electro-optical device according to the present disclosure is applied is not limited to the exemplified apparatuses and may be a personal digital assistant (PDA), a digital camera, a television, a video camera, a car navigation device, a display device for in-vehicle use, an electronic organizer, electronic paper, a calculator, a word processor, a workstation, a video telephone, or a POS terminal. Other examples include an apparatus including a printer, a scanner, a copier, a video player, and a touch panel.

In the above description, a liquid crystal display device is described as an example of the electro-optical device according to the present disclosure, but the electro-optical device according to the present disclosure is not limited thereto. For example, the electro-optical device according to the present disclosure can also be applied to an image sensor or the like. The present disclosure can also be applied to, for example, a display panel that employs a light-emitting device such as an organic electroluminescence (EL) device, an inorganic electroluminescence device or a light emitting polymer in the same manner as the first exemplary embodiment and the second exemplary embodiment described above. Further, the present disclosure can be applied to an electrophoretic display panel that uses micro capsules each including colored liquid and white particles distributed in the liquid, in the same manner as the first exemplary embodiment and the second exemplary embodiment described above.

What is claimed is:

1. An electro-optical device comprising:
a translucent substrate;
a transistor;
a light-shielding body having light-shielding properties and including a metal, the light-shielding body being disposed between the substrate and the transistor;
a first insulating layer having insulating properties and disposed between the light-shielding body and the transistor, the first insulating layer being in contact with the light-shielding body; and
a second insulating layer having insulating properties and disposed between the first insulating layer and the transistor, the second insulating layer being in contact with the first insulating layer, wherein
a content of a predetermined element, that is not an element of a main component in the first insulating layer is higher than a content of the predetermined element in the second insulating layer,
a portion of the first insulating layer is removed by polishing such that a thickness of the first insulating layer is thinner than a thickness of the second insulating layer,
the first insulating layer is arranged between the second insulating layer and the light-shielding body and completely separates the second insulating layer from the light-shielding body,
the predetermined element has a non-zero amount in the first and second insulating layers, and the amount of the main component of the first insulating layer is greater than the amount of the predetermined element in the first insulating layer.

2. The electro-optical device according to claim 1, wherein the predetermined element is fluorine or boron.

3. The electro-optical device according to claim 1, wherein the main component of the first insulating layer and the main component of the second insulating layer each are a translucent silicon-based inorganic material.

4. The electro-optical device according to claim 3, wherein the main component of the first insulating layer and the main component of the second insulating layer each are silicone oxide.

5. An electro-optical device comprising:
a translucent substrate;
a transistor;
a material layer including a silicon-based inorganic material and disposed between the substrate and the transistor;
a first insulating layer having insulating properties and disposed between the material layer and the transistor, the first insulating layer being in contact with the material layer; and
a second insulating layer having insulating properties and disposed between the first insulating layer and the transistor, the second insulating layer being in contact with the first insulating layer, wherein a content of a predetermined element, that is not an element of a main component, in the first insulating layer is higher than a content of the predetermined element in the second insulating layer,
a portion of the first insulating layer is removed by polishing such that a thickness of the first insulating layer is thinner than a thickness of the second insulating layer,
the first insulating layer is arranged between the second insulating layer and the material layer and completely separates the second insulating layer from the material layer,
the predetermined element has a non-zero amount in the first and second insulating layers, and
the amount of the main component of the first insulating layer is greater than the amount of the predetermined element in the first insulating layer.

6. An electronic apparatus, comprising:
the electro-optical device according to claim 1.

7. The electro-optical device according to claim 1, wherein
the translucent substrate has a recess, and
the light-shielding body is disposed in the recess and between the substrate and the transistor.

8. The electro-optical device according to claim 5, wherein the material layer includes a lens layer.

* * * * *